United States Patent
Ku et al.

(10) Patent No.: US 9,880,252 B2
(45) Date of Patent: Jan. 30, 2018

(54) METHOD OF CALIBRATING AND DEBUGGING TESTING SYSTEM

(71) Applicant: MPI CORPORATION, Zhubei (TW)

(72) Inventors: Wei-Cheng Ku, Zhubei (TW); Shao-Wei Lu, Zhubei (TW); Hao Wei, Zhubei (TW); Yu-Tse Wang, Zhubei (TW)

(73) Assignee: MPI CORPORATION, Zhubei (TW)

( * ) Notice: Subject to any disclaimer, the term of this patent is extended or adjusted under 35 U.S.C. 154(b) by 0 days.

(21) Appl. No.: 15/401,987

(22) Filed: Jan. 9, 2017

(65) Prior Publication Data

US 2017/0146634 A1 May 25, 2017

Related U.S. Application Data

(63) Continuation-in-part of application No. 14/553,153, filed on Nov. 25, 2014, now Pat. No. 9,581,676.

(30) Foreign Application Priority Data

Dec. 13, 2013 (TW) .............................. 102146114 A

(51) Int. Cl.
  *G01R 31/00* (2006.01)
  *G01R 35/00* (2006.01)
  *G01R 1/073* (2006.01)

(52) U.S. Cl.
  CPC ........... *G01R 35/005* (2013.01); *G01R 1/073* (2013.01)

(58) Field of Classification Search
  CPC .............. G01R 1/0466; G01R 1/06705; G01R 1/06794; G01R 1/07314; G01R 1/07364; G01R 31/01; G01R 31/028; G01R 31/2863; G01R 31/2889; G01R 31/2891
  See application file for complete search history.

(56) References Cited

U.S. PATENT DOCUMENTS

2007/0040565 A1* 2/2007 Jayabalan .......... G01R 31/2831
  29/593
2010/0148813 A1* 6/2010 Erickson .............. G01R 31/312
  324/754.03

* cited by examiner

*Primary Examiner* — Tung X Nguyen
(74) *Attorney, Agent, or Firm* — Lynette Wylie; Apex Juris, pllc.

(57) ABSTRACT

A method of calibrating and debugging a testing system is provided. First, values of different electrical path segments are calibrated, and parameters of the electrical path segments while being calibrated are saved. After calibration, electrical tests can be processed on a DUT. If the testing system malfunctions, the values of the electrical path segments are calibrated again to compare the current parameters to the previously saved parameters. The component which goes wrong can be found out quickly in this way.

25 Claims, 4 Drawing Sheets

METHOD OF CALIBRATING AND DEBUGGING TESTING SYSTEM

BACKGROUND OF THE INVENTION

1. Technical Field

The present invention relates generally to a testing system, and more particularly to a method of calibrating and debugging a testing system.

2. Description of Related Art

To ensure the quality of electronic products, manufacturers commonly use a testing system to check electrical connections between each precision electronic component in different stages of the manufacturing process.

In most cases, before doing electrical tests, the probes of a testing system may have to be calibrated by using a calibration plate, which does tests and provides information of compensation (i.e., returning to zero) for the probes. However, such compensation is applied to the whole circuit of the testing system at once, without knowing the actual condition of each component. Once a testing system malfunctions, it has to take down and test every component in the testing system one by one just to find the problematic one. The process is time-consuming, and leads to a poor efficiency of maintaining a testing system.

BRIEF SUMMARY OF THE INVENTION

In view of the above, the primary objective of the present invention is to provide a method of calibrating and debugging a testing system, which exactly knows the current condition of each component in the system, and if the testing system malfunctions, the method is able to effectively find out which component goes wrong.

The present invention provides a method of calibrating and debugging a testing system, wherein the testing system includes a test machine, a switching circuit set, and a probe set which are electrically connected sequentially in series, wherein the probe set includes at least one probe and at least one wire; the probe has a first end and a second end, wherein the first end is connected to the at least one wire, so as to be electrically connected to the switching circuit set through the at least one wire, while the second end thereof is adapted to contact a device under test (DUT); an electrical path from the test machine to the switching circuit set is defined as a first electrical path segment, and an electrical path from the test machine to the probe set is defined as a second electrical path segment. The method of calibrating and debugging the testing system includes the following steps: a) calibrate values of the test machine, and save a parameter of the test machine while being calibrated as a first parameter; b) calibrate values of the first electrical path segment, and save a parameter of the first electrical path segment while being calibrated as a second parameter; c) calibrate values of the second electrical path segment, and save a parameter of the second electrical path segment while being calibrated as a third parameter; d) make the probe set contact the DUT to do an electrical test; wherein, after going through steps a) to d), the method further includes subsequent steps: calibrate the values of the test machine, of the first electrical path segment, and of the second electrical path segment; replace the probe with another probe, and calibrate the values of the second electrical path segment; wherein, while taking said subsequent steps to calibrate the values of the test machine, a difference between the first parameter and the parameter of the test machine collected at this time point is compared with a first allowable value, so as to check whether said difference is larger than the first allowable value; wherein, while taking said subsequent steps to calibrate the values of the first electrical path segment, a difference between the second parameter and the parameter of the first electrical path segment collected at this time point is compared with a second allowable value, so as to check whether said difference is larger than the second allowable value; wherein, while taking said subsequent steps to calibrate the values of the second electrical path segment, a difference between the third parameter and the parameter of the second electrical path segment collected at this time point is compared with a third allowable value, so as to check whether said difference is larger than the third allowable value; wherein, while taking said subsequent steps to replace the probe with the another probe and to calibrate the values of the second electrical path segment, a difference between the third parameter and the parameter of the second electrical path segment collected at this time point is compared with the third allowable value, so as to check whether said difference is larger than the third allowable value.

The present invention further provides a method of calibrating and debugging a testing system, wherein the testing system includes a test machine, a switching circuit set, and a probe set which are electrically connected sequentially in series, wherein the probe set includes at least one probe and at least one wire; the probe has a first end and a second end, wherein the first end is connected to the at least one wire, so as to be electrically connected to the switching circuit set through the at least one wire, while the second end thereof is adapted to contact a device under test (DUT); an electrical path from the test machine to the switching circuit set is defined as a first electrical path segment, and an electrical path from the test machine to the probe set is defined as a second electrical path segment. The method of calibrating and debugging the testing system includes the following steps: a) calibrate values of the test machine, and saving a parameter of the test machine while being calibrated as a first parameter; b) calibrate values of the first electrical path segment, and saving a parameter of the first electrical path segment while being calibrated as a second parameter; c) calibrate values of the second electrical path segment, and saving a parameter of the second electrical path segment while being calibrated as a third parameter; d) make the probe set contact the DUT to do an electrical test; wherein, after going through step (a) to step (d), at least one among the following steps is taken: e) calibrate the values of the test machine, and comparing a first allowable value to a difference between the first parameter and the parameter of the test machine collected at this time point, so as to check whether said difference is larger than the first allowable value; f) calibrate the values of the first electrical path segment, and compare a second allowable value to a difference between the second parameter and the parameter of the first electrical path segment collected at this time point, so as to check whether said difference is larger than the second allowable value; g) calibrate the values of the second electrical path segment, and compare a third allowable value to a difference between the third parameter and the parameter of the second electrical path segment collected at this time point, so as to check whether said difference is larger than the third allowable value; h) replace the probe with another probe, calibrate the values of the second electrical path segment, and compare the third allowable value to a difference between the third parameter and the parameter of the second electrical path segment collected at this time point, so as to check whether said difference is larger than the third allowable value.

With the aforementioned design of the method of calibrating and debugging the testing system, the current condition of each component of the testing system can be exactly known. Furthermore, when the testing system malfunctions, the component which goes wrong can be quickly found out.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
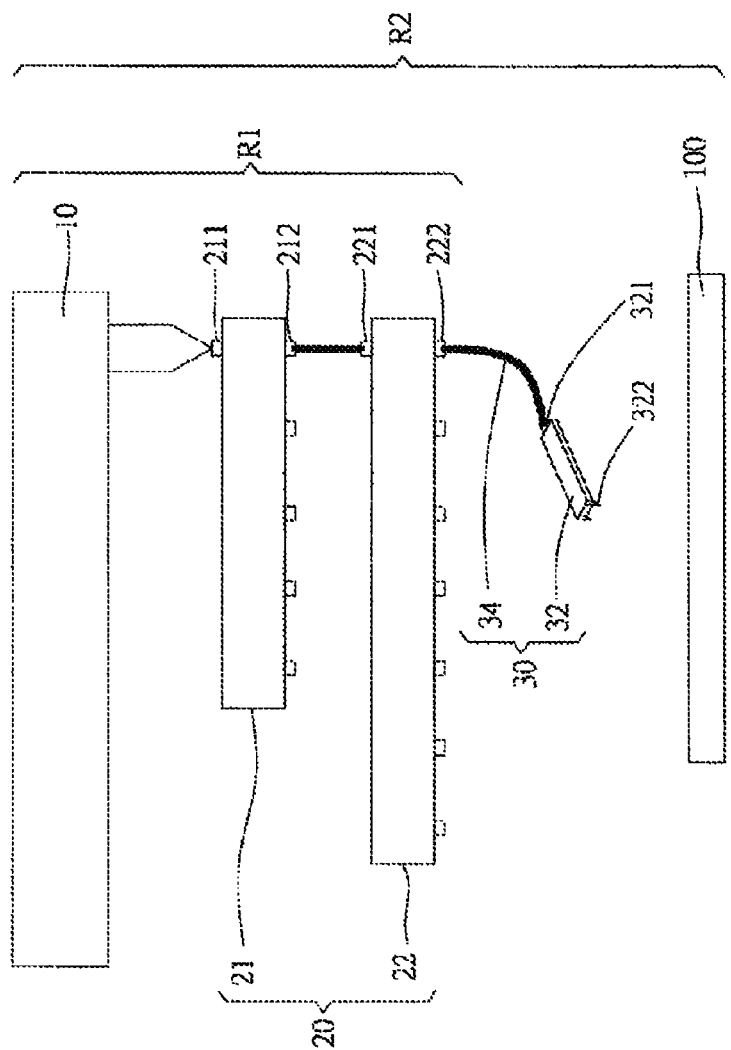
FIG. 1 is a schematic diagram of a testing system suitable for a preferred embodiment of the present invention.

As shown in FIG. 1, a testing system which is suitable for applying a method of calibrating and debugging of the preferred embodiment of the present invention mainly includes a test machine 10, a switching circuit set 20, and a probe set 30 electrically connected sequentially in series.

The test machine 10 generates test signals to do electrical tests, and is capable of determining test results according to signals sent back.

The switching circuit set 20 has a first switching circuit 21 and a second switching circuit 22, which respectively have an input port 211, 221 and a plurality of output ports 212, 222. The switching circuits 21,22 are both controllable to respectively establish electric conductivity between the input port 211 and one of the outputs 212, and between the input port 221 and one of the output ports 222. The input port 211 of the first switching circuit 21 is electrically connected to the test machine 100. The input port 221 of the second switching circuit 22 is electrically connected to one of the output ports 212 of the first switching circuit 21. In addition, the output ports 222 of the second switching circuit 22 are electrically connected to the probe set 30.

The probe set 30 includes a plurality of probes 32 and a plurality of wires 34 which are connected together one to one, wherein the wires 34 are respectively connected to the output ports 222 of the second switching circuit 22. Herein, a pair composed of one of the probes 32 and the connected wire 34 is used for explanation. However, this does not imply any limitation on the numbers of the probes 32 and the wires 34. The probe 32 has a first end 321 and a second end 322, wherein the first end 321 is connected to the wire 34, and is electrically connected to one of the output ports 222 of the second switching circuit 22 through the wire 34, while the second end 322 contacts a device under test (DUT) 100. In addition, an electrical path from the test machine 10 to an end of the switching circuit set 20 is defined as a first electrical path segment R1, and an electrical path from the test machine 10 to an end of the probe set 30 (i.e., the second end 322) is defined as a second electrical path segment R2.

Figure 2:
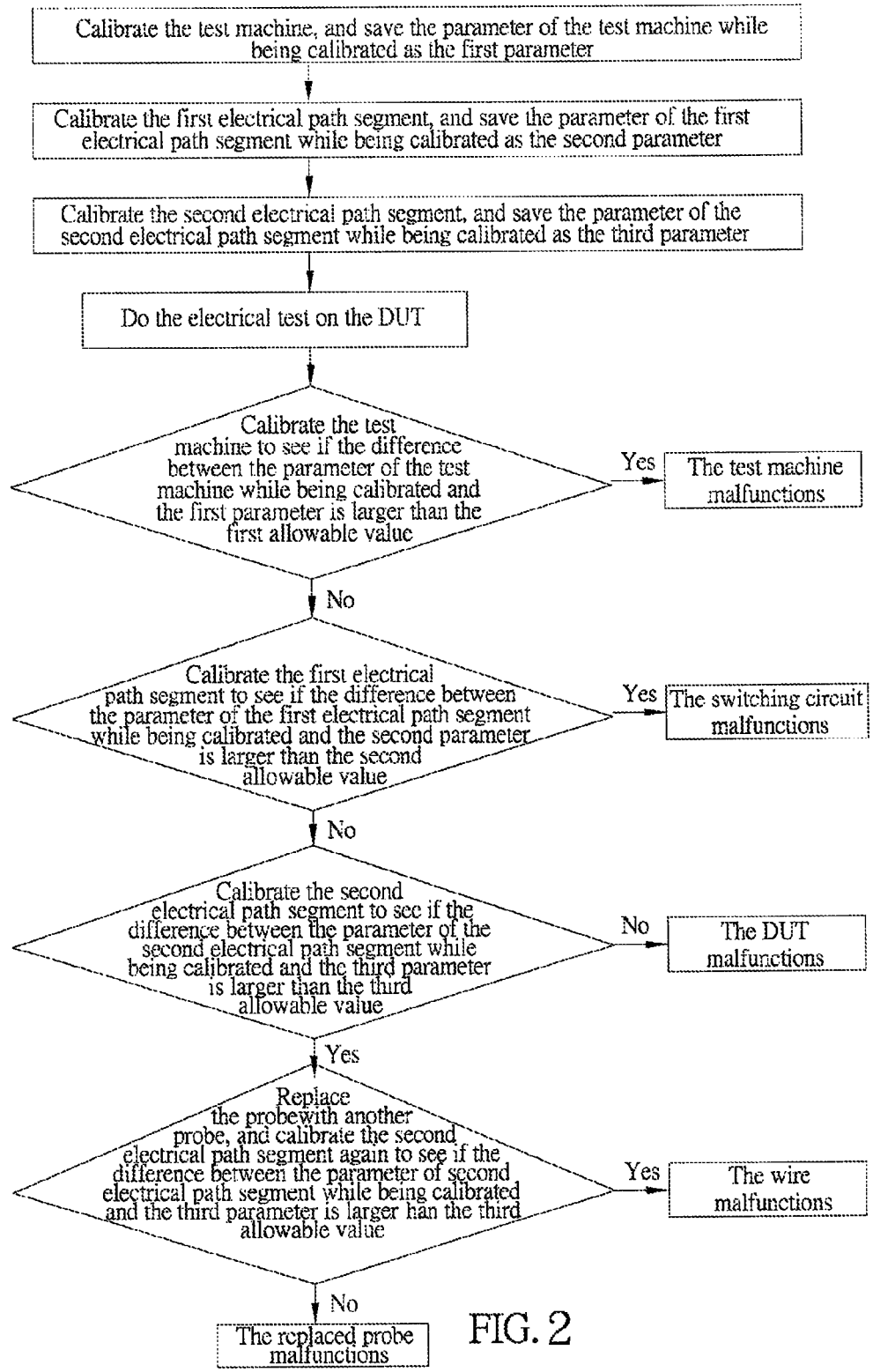
FIG. 2 is a flow chart of the preferred embodiment of the present invention.

As shown in FIG. 2, before the testing system doing an electrical test, the method of calibrating the testing system can be applied first to ensure the accuracy while doing the test, which includes the following steps:

Calibrate values of the test machine 10, and save a parameter of the test machine 10 while being calibrated as a first parameter. In the preferred embodiment, the calibration of values described herein is the compensation on values based on results of short-circuit test, open-circuit test, and impedance test, and the compensated values are saved as the first parameter.

Calibrate values of the first electrical path segment R1, and save a parameter of the first electrical path segment R1 while being calibrated as a second parameter. In the preferred embodiment, the output ports 212 of the first switching circuit 21 which are not connected to the second switching circuit 22 are respectively provided with a short-circuit structure, an open-circuit structure, and an impedance structure. With these structures, the short-circuit test, open-circuit test, and impedance test can be done by controlling the electric conductivity between the input port 211 of first switching circuit 21 and the output ports 212 which are not connected to the second switching circuit 22, which would provide useful results for calibration. In other embodiments, it can only have one or two tests among the short-circuit, open-circuit, and impedance tests to be done, or, these tests can be alternatively done on the output ports 222 of the second switching circuit 22 which are not connected to the probe set 30. In either case, the value of the first electrical path segment R1 can be still calibrated as well.

Calibrate values of the second electrical path segment R2, and save a parameter of the second electrical path segment R2 while being calibrated as a third parameter. In the preferred embodiment, the aforementioned tests for calibration are done on the second end 322 of the probes 32 by making the second end 322 sequentially contact a short-circuit contact point, an open-circuit contact point, and an impedance contact point on a calibration plate (not shown), and the values of the second electrical path segment R2 are calibrated (i.e., returning to zero, compensation on values, etc.) based on the results of the tests.

In this way, once the process of calibration is completed, the probe set 30 is moved to contact the DUT 100 to do the electrical test on the DUT 100. Furthermore, the aforementioned method of calibrating the testing system also provides parameters of the test machine 10, the first electrical path segment R1, and the second electrical path segment R2, which can be used as a basis to determine the current condition of installation or aging of the test machine 10, the switching circuit set 20, and the probe set 30.

In addition to the aforementioned method of calibrating the testing system, when the testing system malfunctions, a method of debugging the testing system is also provided in the present invention to quickly find out the problematic component. The method of debugging the testing system includes the following steps:

Calibrate the values of the test machine 10 again in the same way described above, and then compare a difference between the first parameter and a parameter of the test machine 10 while being currently calibrated to a first allowable value. If the difference is larger than the first allowable value, it means the test machine 10 malfunctions; otherwise, it might be other parts of the testing system going wrong.

Calibrate the values of the first electrical path segment R1 again in the same way as how the previous calibration for the first electrical path segment R1 does if the test machine 10 is not the cause of the malfunction. After that, compare a difference between the second parameter and a parameter of the first electrical path segment R1 while being currently calibrated to a second allowable value. If the difference is larger than the second allowable value, it means the switching circuit set 20 malfunctions; otherwise, it might be other parts of the testing system going wrong.

Calibrate the values of the second electrical path segment R2 again in the same way as how the previous calibration for the second electrical path segment R2 does if neither of the test machine 10 nor the first electrical path segment R1 is the cause of the malfunction. After that, compare a difference between the third parameter and a parameter of the second electrical path segment R2 while being currently calibrated to a third allowable value. If the difference is larger than the third allowable value, it means the probe set 30 malfunctions; otherwise, it is the DUT 100 going wrong.

If the probe set 30 malfunctions, the exact malfunctioning component in the probe set 30 can be further pointed out by replacing the probe 32 with another normal probe and calibrating the values of the second electrical path segment R2 again. If a difference between the third parameter and a parameter of the second electrical path segment R2 while being currently calibrated is larger than the third allowable value, it means the wire 34 malfunctions; otherwise, it is the replaced probe 32 malfunctions.

It is worth mentioning, the aforementioned first allowable value, second allowable value, and third allowable value can be values or ratios of differences between the previously saved parameters and the current parameters. Furthermore, the first allowable value, the second allowable value, and the third allowable value can be all equal, or can be different depending on different requirements.

The aforementioned method of calibrating and debugging a testing system is merely one embodiment among many plausible embodiments. It is worth mentioning that, in the method provided in the present invention, the steps regarding debugging the test machine, the first electrical path segment, and the second electrical path segment, and the step of replacing the probe with another probe and doing the calibration again are not necessary to be taken in the aforementioned order. For example, in another embodiment, the step of debugging the first electrical path segment could be taken first, with the other steps (i.e., the steps of debugging the test machine, debugging the second electrical path segment, and replacing the probe with another probe for calibration) being taken in sequence afterwards. In yet another embodiment, it could be the step of debugging the second electrical path segment to be taken first, with other steps being taken in a different order afterwards (e.g., debugging the first electrical path segment, replacing the probe with another probe for calibration, and then debugging the test machine as the last step).

In addition, it is not necessary to every aforementioned step, whether in a particular sequence or not, in other embodiments. The method of calibrating and debugging a testing system of another embodiment is provided herein for ease of understanding, wherein the testing system illustrated in FIG. 1 is still used in the current embodiment. Therefore, we are not going to describe the details of the testing system again. On the other hand, the steps in the current embodiment are also the same as the steps shown in FIG. 2, so we are not going to explain the steps herein, either. The difference between the current embodiment and the previous embodiment is that there are additional steps which could be taken after going through step A (i.e., calibrating values of the test machine 10), step B (i.e., calibrating values of the first electrical path segment R1), step C (i.e., calibrating values of the second electrical path segment R2), to step D (i.e., making the probe set 30 contact the DUT 100 to do an electrical test). Said additional steps are listed as step E to step H below, wherein the method of debugging the testing system in the current embodiment takes at least one step among them:

Step E: calibrating the values of the test machine 10, and comparing the first allowable value to a difference between the first parameter and the parameter of the test machine 10 while being calibrated, so as to check whether said difference is larger than the first allowable value;

Step F, calibrating the values of the first electrical path segment R1, and comparing the second allowable value to a difference between the second parameter and the parameter of the first electrical path segment R1 while being calibrated, so as to check whether said difference is larger than the second allowable value, wherein, as disclosed in the previous embodiment, the tests would be done at the output ports 212 of the first switching circuit 21 which are not connected to the second switching circuit 22, whereby the comparison can be made on the same basis. Needless to say, if the basis for the previous calibration is the tests done at the output ports 222 of the second switching circuit 22 which are not connected, the current step would do tests at the output ports 222 of the second switching circuit 22 which are not connected as well;

Step G, calibrating the values of the second electrical path segment R2, and comparing the third allowable value to a difference between the third parameter and the parameter of the second electrical path segment R2 while being calibrated, so as to check whether said difference is larger than the third allowable value, wherein, as disclosed in the previous embodiment, the calibration is also made at the second end 322;

Step H, replacing the probe 32 with another probe 32 which functions normally, calibrating the values of the second electrical path segment R2, and comparing the third allowable value to a difference between the third parameter and the parameter of the second electrical path segment R2 while being calibrated, so as to check whether said difference is larger than the third allowable value.

Figure 3A:
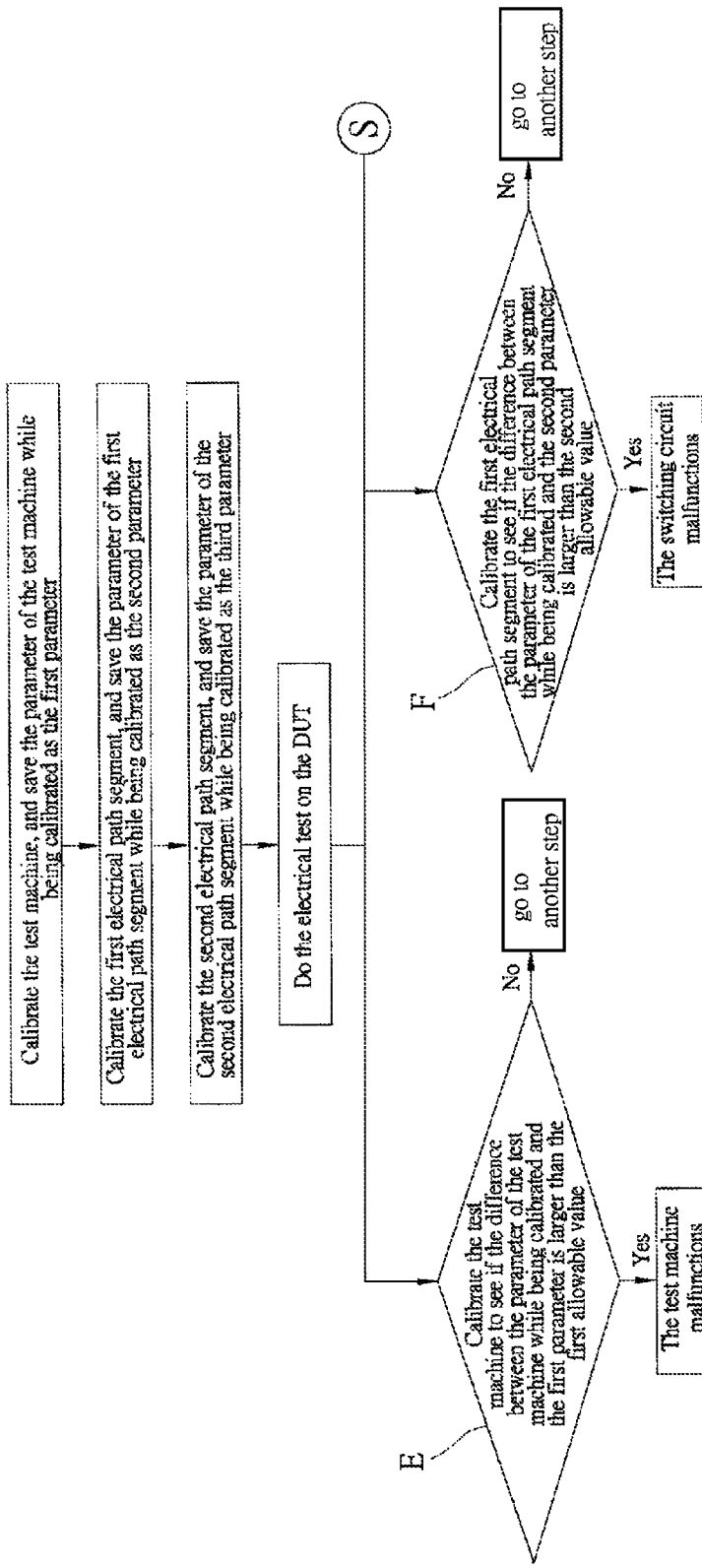
FIG. 3A and 3b could be combined to show a complete flow chart of another preferred embodiment of the present invention.
Figure 3B:
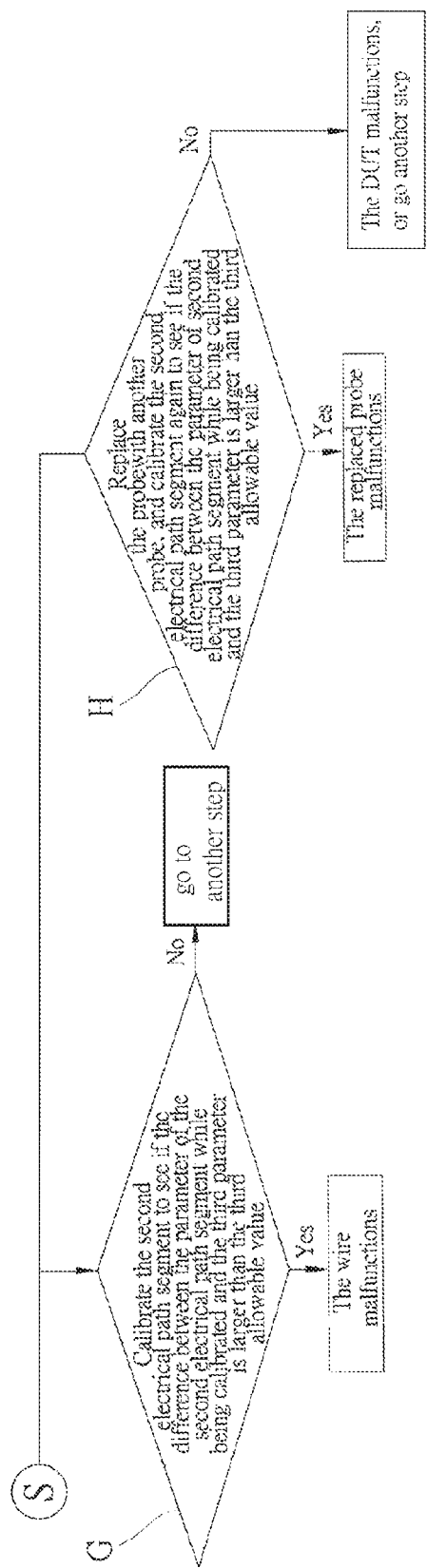

As shown in FIGS. 3A and 3B, the current embodiment could take at least one step among steps E, F, G, and H after going through step A to step D. For example:

If step E is selected to be taken, the comparison is made to check whether the difference between the first parameter and the parameter of the test machine 10 while being calibrated this time is larger than the first allowable value;

If so, then it means the test machine 10 malfunctions.

Otherwise, other steps of the method of debugging (e.g., steps F, G, or H) could be further selected to be taken.

If step E is selected to be taken, the comparison is made to check whether the difference between the second parameter and the parameter of the first electrical path segment R1 while being calibrated this time is larger than the second allowable value;

If so, it means the switching circuit set 20 malfunctions.

Otherwise, other steps of the method of debugging (e.g., steps E, G, or H) could be further selected to be taken.

If step G is selected to be taken, the comparison is made to check whether the difference between the third parameter and the parameter of the second electrical path segment R2 while being calibrated this time is larger than the third allowable value;

If so, it means the wires 34 malfunctions.

Otherwise, other steps of the method of debugging (e.g., steps E, F, or H) could be further selected to be taken.

If step H is selected to be taken, the comparison is made to check whether the difference between the third parameter and the parameter of the second electrical path segment R2 while being calibrated this time is larger than the third allowable value;

If so, it means the replaced probe 32 malfunctions.

Otherwise, it means the DUT 100 malfunctions, and other steps of the method of debugging (e.g., steps E, F, or G) could be further selected to be taken.

In addition, in another embodiment, two steps among the aforementioned steps E, F, G, H of the method of debugging can be taken after going through steps A-D of the method of calibration, wherein, said two steps could be one among the following combinations: step E and step F; step E and step G; step E and step H; step F and step G; step F and step H; and step G and step H. The selected two steps can be taken in an arbitrary order. Fox example, say the combination of step E and step F is selected, step E could be taken first and then step F, or the other way around. If it is another combination of two steps to be selected, the two steps contained within could be taken in an arbitrary order based on the same concept described herein.

In addition, in another embodiment, three steps among the aforementioned steps E, F, G, H of the method of debugging can be taken after going through steps A-D of the method of calibration, wherein, said three steps could be one among the following combinations: step E, step F and step G; step E, step F and step H; step E, step G and step H; step F, step G and step H. The selected three steps can be taken in an arbitrary order. Fox example, say the combination of step E, step F, and step G is selected, these steps could be taken in any of the following sequences: steps E, F, G, steps E, G, F, steps F, G, E, steps F, E, G, steps G, E, F, or steps G, F, E. If it is another combination of three steps to be selected, the three steps contained within could be taken in an arbitrary order based on the same concept described herein.

In addition, in another embodiment, after going through the steps A-D of the method of calibration, the values of the test machine 10, of the first electrical path segment R1, and of the second electrical path segment R2 can be calibrated, and the probe 32 can be replaced with another probe 32 before calibrating the values of the second electrical path segment R2.

Wherein, while calibrating the values of the test machine 10, it has to check whether the difference between the first parameter and the parameter of the test machine 10 is larger than the first allowable value;

Wherein, while calibrating the values of the first electrical path segment R1, it has to check whether the difference between the second parameter and the parameter of the first electrical path segment R1 is larger than the second allowable value;

Wherein, while calibrating the values of the second electrical path segment R2, it has to check whether the difference between the third parameter and the parameter of the second electrical path segment R2 is larger than the third allowable value;

Wherein, while replacing the probe 32 with another probe 32 and calibrating the values of the second electrical path segment R2, it has to check whether the difference between the third parameter and the parameter of the second electrical path segment R2 is larger than the third allowable value.

More specifically, the current embodiment can also take all steps of the method of debugging (i.e., steps E, F, G, H) in an arbitrary order. The following combination is taken as an example, but not a limitation of the present invention:

(1) Calibrate the values of the test machine 10 first, and then calibrate the values of the first electrical path segment R1; after that, replace the probe 32 with another probe 32 and calibrate the values of the second electrical path segment R2, and then calibrate the values of the second electrical path segment R2 again. In other words, the order of taking the steps is step E first, and then step F, and then step H, and finally step G.

(2) Calibrate the values of the test machine 10 first, and then calibrate the values of the second electrical path segment R2; afterwards, the other two steps are taken, wherein either the values of the first electrical path segment R1 is calibrated first, or the probe 32 is replaced with another probe 32 and the values of the second electrical path segment R2 is calibrated first. In other words, step E is taken first, and then step G; after that, steps F and H are taken in an arbitrary order.

(3) Calibrate the values of the test machine 10 first, and then replace the probe 32 with another probe 32 and calibrate the values of the second electrical path segment R2; afterwards, the other two steps are taken, wherein either the values of the first electrical path segment R1 is calibrated first, or the values of the second electrical path segment R2 is calibrated first. In other words, step E is taken first, and then step H; after that, steps F and G are taken in an arbitrary order.

(4) Calibrate the values of the first electrical path segment R1 first; afterwards, the other three steps are taken, wherein either the values of the test machine 10 is calibrated first, the values of the second electrical path segment R2 is calibrated first, or the probe 32 is replaced with another probe 32 and the values of the second electrical path segment R2 is calibrated first. In other words, step F is taken first, and then steps E, G, and H are taken in an arbitrary order.

(5) Calibrate the values of the second electrical path segment R2 first; afterwards, the other three steps are taken, wherein either the values of the test machine 10 is calibrated first, the values of the first electrical path segment R1 is calibrated first, or the probe 32 is replaced with another probe 32 and the values of the second electrical path segment R2 is calibrated first. In other words, step G is taken first, and then steps E, F, and H are taken in an arbitrary order.

(6) Replace the probe 32 with another probe 32 and calibrate the values of the second electrical path segment R2 first; afterwards, the other three steps are taken, wherein either the values of the test machine 10 is calibrated first, the values of the first electrical path segment K is calibrated first, or the values of the second electrical path segment R2 is calibrated first. In other words, step H is taken first, and then steps E, F, and G are taken in an arbitrary order.

In summary, with the method of calibrating and debugging a testing system provided in the present invention, the current condition of every component can be precisely known, and once if the testing system malfunctions, the problematic component can be quickly found out. The embodiment described above is only a preferred embodiment of the present invention. All equivalent methods which employ the concepts disclosed in this specification and the appended claims should fall within the scope of the present invention.

What is claimed is:

1. A method of calibrating and debugging a testing system, wherein the testing system includes a test machine, a switching circuit set, and a probe set which are electrically connected sequentially in series, wherein the probe set comprises at least one probe and at least one wire; the probe has a first end and a second end, wherein the first end is connected to the at least one wire, so as to be electrically connected to the switching circuit set through the at least one wire, while the second end thereof is adapted to contact a device under test (DUT); an electrical path from the test machine to the switching circuit set is defined as a first electrical path segment, and an electrical path from the test machine to the probe set is defined as a second electrical path segment; comprising the steps of:

(a) calibrating values of the test machine, and saving a parameter of the test machine while being calibrated as a first parameter;

(b) calibrating values of the first electrical path segment, and saving a parameter of the first electrical path segment while being calibrated as a second parameter;

(c) calibrating values of the second electrical path segment, and saving a parameter of the second electrical path segment while being calibrated as a third parameter;

(d) making the probe set contact the DUT to do an electrical test;

wherein, after going through steps (a) to (d), the method further comprises subsequent steps of:

calibrating the values of the test machine, of the first electrical path segment, and of the second electrical path segment;

replacing the probe with another probe, and calibrating the values of the second electrical path segment;

wherein, while taking said subsequent steps to calibrate the values of the test machine, a difference between the first parameter and the parameter of the test machine collected at this time point is compared with a first allowable value, so as to check whether said difference is larger than the first allowable value;

wherein, while taking said subsequent steps to calibrate the values of the first electrical path segment, a difference between the second parameter and the parameter of the first electrical path segment collected at this time point is compared with a second allowable value, so as to check whether said difference is larger than the second allowable value;

wherein, while taking said subsequent steps to calibrate the values of the second electrical path segment, a difference between the third parameter and the parameter of the second electrical path segment collected at this time point is compared with a third allowable value, so as to check whether said difference is larger than the third allowable value;

wherein, while taking said subsequent steps to replace the probe with the another probe and to calibrate the values of the second electrical path segment, a difference between the third parameter and the parameter of the second electrical path segment collected at this time point is compared with the third allowable value, so as to check whether said difference is larger than the third allowable value.

2. The method of claim 1, wherein, said subsequent steps are taken in the following sequence: the step of calibrating the values of the test machine is taken first, and then the step of calibrating the values of the first electrical path segment is taken, and then the step of replacing the probe with the another probe and calibrating the values of the second electrical path segment is taken, and, finally, the step of calibrating the values of the second electrical path segment is taken.

3. The method of claim 1, wherein, in said subsequent steps, the values of the test machine are calibrated first, and then the values of the second electrical path segment are calibrated.

4. The method of claim 1, wherein, in said subsequent steps, the values of the test machine are calibrated first, and then the probe is replaced by the another probe, and the values of the second electrical path segment are calibrated.

5. The method of claim 1, wherein, in said subsequent steps, the values of the first electrical path segment are calibrated first.

6. The method of claim 1, wherein, in said subsequent steps, the values of the second electrical path segment are calibrated first.

7. The method of claim 1, wherein, in said subsequent steps, the probe is replaced by the another probe, and the values of the second electrical path segment are calibrated first.

8. The method of claim 1, wherein the values of the test machine, of the first electrical path segment, and of the second electrical path segment are calibrated by being compensated according to results of at least one test among a short-circuit test, an open-circuit test, and an impedance test; the compensated values of the test machine, the first electrical path segment, and the second electrical path segment are respectively saved as the first, the second, and the third parameter.

9. The method of claim 1, wherein the switching circuit set has a first switching circuit and a second switching circuit; each of the switching circuits respectively has an input port and a plurality of output ports; the input port of the first switching circuit is electrically connected to the test machine; the input port of the second switching circuit is electrically connected to one of the output ports of the first switching circuit; at least one output port of the second switching circuit is electrically connected to the probe set; the values of the first electrical path segment are calibrated according to results of tests done on at least one output port of the first switching circuit which is not connected to the second switching circuit in step (b).

10. The method of claim 9, wherein, in said subsequent steps, the values of the first electrical path segment are calibrated according to results of tests done on at least one output port of the first switching circuit which is not connected to the second switching circuit.

11. The method of claim 1, wherein the switching circuit set has a first switching circuit and a second switching circuit; each of the switching circuits respectively has an input port and a plurality of output ports; the input port of the first switching circuit is electrically connected to the test machine; the input port of the second switching circuit is electrically connected to one of the output ports of the first switching circuit; at least one output port of the second switching circuit is electrically connected to the probe set; the values of the first electrical path segment are calibrated according to results of tests done on at least one output port of the second switching circuit which is not connected to the probe set.

12. The method of claim 11, wherein, in said subsequent steps, the values of the first electrical path segment are calibrated according to results of tests done on at least one output port of the second switching circuit which is not connected to the probe set.

13. The method of claim 11, wherein the probe set has a first end and a second end;

the first end of the probe set is electrically connected to the switching circuit set; the second end of the probe set contacts the DUT; the values of the second electrical path segment are calibrated according to results of tests done on the second end of the probe set in step (c).

14. The method of claim 13, wherein, in said subsequent steps, the values of the second electrical path segment are calibrated according to results of tests done on the second end of the probe set.

15. A method of calibrating and debugging a testing system, wherein the testing system includes a test machine, a switching circuit set, and a probe set which are electrically connected sequentially in series, wherein the probe set comprises at least one probe and at least one wire; the probe has a first end and a second end, wherein the first end is connected to the at least one wire, so as to be electrically connected to the switching circuit set through the at least one wire, while the second end thereof is adapted to contact a device under test (DUT); an electrical path from the test machine to the switching circuit set is defined as a first electrical path segment, and an electrical path from the test machine to the probe set is defined as a second electrical path segment; comprising the steps of:
  (a) calibrating values of the test machine, and saving a parameter of the test machine while being calibrated as a first parameter;
  (b) calibrating values of the first electrical path segment, and saving a parameter of the first electrical path segment while being calibrated as a second parameter;
  (c) calibrating values of the second electrical path segment, and saving a parameter of the second electrical path segment while being calibrated as a third parameter;
  (d) making the probe set contact the DUT to do an electrical test;
  wherein, after going through step (a) to step (d), at least one among the following steps is taken:
  (e) calibrating the values of the test machine, and comparing a first allowable value to a difference between the first parameter and the parameter of the test machine collected at this time point, so as to check whether said difference is larger than the first allowable value;
  (f) calibrating the values of the first electrical path segment, and comparing a second allowable value to a difference between the second parameter and the parameter of the first electrical path segment collected at this time point, so as to check whether said difference is larger than the second allowable value;
  (g) calibrating the values of the second electrical path segment, and comparing a third allowable value to a difference between the third parameter and the parameter of the second electrical path segment collected at this time point, so as to check whether said difference is larger than the third allowable value;
  (h) replacing the probe with another probe, calibrating the values of the second electrical path segment, and comparing the third allowable value to a difference between the third parameter and the parameter of the second electrical path segment collected at this time point, so as to check whether said difference is larger than the third allowable value.

16. The method of claim 15, wherein only two steps among steps (e) to (h) are taken in an arbitrary order; said two steps are one among the following combinations:
  steps (e) and (f);
  steps (e) and (g);
  steps (e) and (h);
  steps (f) and (g);
  steps (f) and (h); and
  steps (g) and (h).

17. The method of claim 15, wherein only three steps among steps (e) to (h) are taken in an arbitrary order; said three steps are one among the following combinations:
  steps (e), (f), and (h);
  steps (e), (g), and (h); and
  steps (f), (g), and (h).

18. The method of claim 15, wherein only three steps among steps (e) to (h) are taken, which are in one of the following orders:
  step (e) is taken first, and then step (g), and finally step (f);
  step (f) is taken first, and then step (g), and finally step (e);
  step (f) is taken first, and then step (e), and finally step (g);
  step (g) is taken first, and then step (e), and finally step (f); and
  step (g) is taken first, and then step (f), and finally step (e).

19. The method of claim 15, wherein the values of the test machine, of the first electrical path segment, and of the second electrical path segment are calibrated by being compensated according to results of at least one test among a short-circuit test, an open-circuit test, and an impedance test; the compensated values of the test machine, the first electrical path segment, and the second electrical path segment are respectively saved as the first, the second, and the third parameter.

20. The method of claim 15, wherein the switching circuit set has a first switching circuit and a second switching circuit; each of the switching circuits respectively has an input port and a plurality of output ports; the input port of the first switching circuit is electrically connected to the test machine; the input port of the second switching circuit is electrically connected to one of the output ports of the first switching circuit; at least one output port of the second switching circuit is electrically connected to the probe set; the values of the first electrical path segment are calibrated according to results of tests done on at least one output port of the first switching circuit which is not connected to the second switching circuit in step (b).

21. The method of claim 20, wherein, in step (f), the values of the first electrical path segment are calibrated according to results of tests done on at least one output port of the first switching circuit which is not connected to the second switching circuit.

22. The method of claim 15, wherein the switching circuit set has a first switching circuit and a second switching circuit; each of the switching circuits respectively has an input port and a plurality of output ports; the input port of the first switching circuit is electrically connected to the test machine; the input port of the second switching circuit is electrically connected to one of the output ports of the first switching circuit; at least one output port of the second switching circuit is electrically connected to the probe set; the values of the first electrical path segment are calibrated according to results of tests done on at least one output port of the second switching circuit which is not connected to the probe set in steps (b) and (f).

23. The method of claim 22, wherein, in step (f), the values of the first electrical path segment are calibrated according to results of tests done on at least one output port of the second switching circuit which is not connected to the probe set.

24. The method of claim 15, wherein the probe set has a first end and a second end;
  the first end of the probe set is electrically connected to the switching circuit set; the second end of the probe set contacts the DUT; the values of the second electrical path segment are calibrated according to results of tests done on the second end of the probe set in step (c).

25. The method of claim 24, wherein the values of the second electrical path segment are calibrated according to results of tests done on the second end of the probe set in step (g).

* * * * *